US012681596B2

(12) United States Patent
Huang et al.

(10) Patent No.: US 12,681,596 B2
(45) Date of Patent: Jul. 14, 2026

(54) TOUCH DISPLAY DEVICE

(71) Applicant: Lite-On Technology Corporation,
Taipei (TW)

(72) Inventors: Chun-Chieh Huang, Taipei (TW);
Ming-Fu Yen, Taipei (TW);
Ching-Lung Cheng, Taipei (TW);
Chen Jung Ni, Taipei (TW)

(73) Assignee: Lite-On Technology Corporation,
Taipei (TW)

( * ) Notice: Subject to any disclaimer, the term of this
patent is extended or adjusted under 35
U.S.C. 154(b) by 0 days.

(21) Appl. No.: 18/988,857

(22) Filed: Dec. 19, 2024

(65) Prior Publication Data

US 2025/0315121 A1      Oct. 9, 2025

Related U.S. Application Data

(60) Provisional application No. 63/573,484, filed on Apr.
3, 2024.

(30) Foreign Application Priority Data

Nov. 8, 2024      (CN) ......................... 202422727777.X

(51) Int. Cl.
| | |
|---|---|
| *G06F 3/041* | (2006.01) |
| *G06F 3/01* | (2006.01) |
| *H10H 29/14* | (2025.01) |
| *H10H 29/80* | (2025.01) |
| *H10H 29/855* | (2025.01) |

(52) U.S. Cl.
CPC ............ *G06F 3/0416* (2013.01); *G06F 3/016*
(2013.01); *G06F 3/0412* (2013.01); *H10H*
*29/142* (2025.01); *H10H 29/842* (2025.01);
*H10H 29/8552* (2025.01); *G06F 2203/04108*
(2013.01)

(58) Field of Classification Search
None
See application file for complete search history.

(56) References Cited

U.S. PATENT DOCUMENTS

| | | | | |
|---|---|---|---|---|
| 2011/0102326 A1* | 5/2011 | Casparian | .............. | H01H 13/85 |
| | | | | 340/407.2 |
| 2018/0218859 A1* | 8/2018 | Ligtenberg | .............. | G06F 1/165 |

* cited by examiner

*Primary Examiner* — Stephen T. Reed
(74) *Attorney, Agent, or Firm* — JCIPRNET

(57) ABSTRACT

A touch display device is provided, including a circuit board,
a backlight module, a plurality of light-emitting elements, a
plurality of piezoelectric elements, and a panel. The circuit
board has a first surface and a second surface. The circuit
board is provided with a first control unit, a first driver
group, a second control unit, and a second driver group. The
backlight module is disposed on the first surface of the
circuit board. The plurality of light-emitting elements are
disposed on the first surface of a circuit board. The panel is
stacked on the backlight module. The first control unit is
adapted to control the first driver group to drive at least one
of the plurality of piezoelectric elements to vibrate, and the
second control unit is adapted to control the second driver
group to drive at least one of the plurality of light-emitting
elements to emit light.

18 Claims, 10 Drawing Sheets

TOUCH DISPLAY DEVICE

CROSS-REFERENCE TO RELATED APPLICATION

This application claims the priority benefit of U.S. provisional application Ser. No. 63/573,484, filed on Apr. 3, 2024, and China application serial no. 202422727777. X, filed on Nov. 8, 2024. The entirety of each of the above-mentioned patent applications is hereby incorporated by reference herein and made a part of this specification.

BACKGROUND

Technical Field

The invention relates to a display device, and in particular to a touch display device.

Description of Related Art

A portable electronic device such as a laptop computer is often equipped with a touch pad. Users may operate the electronic device via the touch pad to input gesture commands. Currently, the touch panels of some electronic devices also have a display effect to provide additional text or imaging information and allow the user to interact with the information. However, such a touch panel can typically display only preset images in a limited area on the touch panel, and the display mode is inflexible, and the text or imaging content and position cannot be dynamically changed according to the user's needs. Therefore, the display content and effect are restricted.

SUMMARY

The invention provides a touch display device, allowing the display effect to be flexibly changed according to the user's need.

A touch display in the invention includes a circuit board, a backlight module, a plurality of light-emitting elements, a plurality of piezoelectric elements, and a panel. The circuit board has a first surface and a second surface opposite to each other. The circuit board is provided with a first control unit, a first driver group, a second control unit, and a second driver group. The backlight module is disposed on the first surface of the circuit board. The plurality of light-emitting elements are disposed in arrays on the first surface of a circuit board and each surrounded by the backlight module. The plurality of piezoelectric elements are disposed on the second surface of the circuit board. The panel is stacked on the backlight module. The first control unit is adapted to control the first driver group to drive at least one of the plurality of piezoelectric elements to vibrate, and the second control unit is adapted to control the second driver group to drive at least one of the plurality of light-emitting elements to emit light.

In an embodiment of the invention, the backlight module includes a plurality of accommodating spaces, and the plurality of light-emitting elements are located in the plurality of accommodating spaces, respectively.

In an embodiment of the invention, the plurality of light-emitting elements are distributed individually or in groups in the plurality of accommodating spaces. That is, each of the plurality of accommodating spaces has at least one of the plurality of light-emitting elements therein.

In an embodiment of the invention, the touch display device further includes a touch sensing unit. The touch sensing unit is electrically connected to the circuit board and is adapted to sense a touch input command and generate a touch sensing signal.

In an embodiment of the invention, the first control unit is adapted to control the first driver group to drive the at least one of the plurality of piezoelectric elements to vibrate according to the touch sensing signal.

In an embodiment of the invention, the second control unit is adapted to control the second driver group to drive the at least one of the plurality of light-emitting elements to emit light according to the touch sensing signal.

In an embodiment of the invention, the touch sensing unit is adapted to sense a plurality of touch input commands and generate a plurality of touch sensing signals, and the second control unit is adapted to control the second driver group to drive different light-emitting elements among the plurality of light-emitting elements to emit light according to the plurality of touch sensing signals.

In an embodiment of the invention, the circuit board has a first area and a second area on a lateral side of the first area, and that is, the first area and the second area are adjacent to each other. The plurality of light-emitting elements include a plurality of first light-emitting elements and a plurality of second light-emitting elements, and the plurality of first light-emitting elements are disposed in the first area. The plurality of second light-emitting elements are disposed in the second area.

In an embodiment of the invention, some of the plurality of first light-emitting elements are disposed in the first area and some are disposed in the second area. Meanwhile, some of the plurality of second light-emitting elements are disposed in the first area and some are disposed in the second area.

In an embodiment of the invention, the second driver group includes a first driver unit and a second driver unit. The first driver unit is adapted to drive at least one of the plurality of first light-emitting elements to emit light. The second driver unit is adapted to drive at least one of the plurality of second light-emitting elements to emit light.

In an embodiment of the invention, the touch display device further includes a proximity sensing unit. The proximity sensing unit is electrically connected to the circuit board and is adapted to sense a distance between an external object and the panel and generate a proximity sensing signal, and the proximity sensing signal wakes the first control unit and the second control unit up.

Another touch display in the invention includes a circuit board, a backlight module, a plurality of light-emitting element, and a panel. The circuit board has a first surface and a second surface opposite to each other. The backlight module is disposed on the first surface of the circuit board. The backlight module includes an optical film group, a light shielding portion, a plurality of accommodating spaces, and a plurality of opaque layers. The light shielding portion is secured to the first surface of the circuit board and is adjacent to the plurality of accommodating spaces. That is, each of the accommodating spaces is adjacent to the light shielding portion. The plurality of light-emitting elements are disposed in arrays on the first surface of the circuit board, and each of the plurality of light-emitting element is located in the corresponding accommodating space. The panel is stacked on the optical film group, the optical film group is stacked on the light shielding portion, and the plurality of opaque layers are attached to the optical film group.

In an embodiment of the invention, each of the accommodating spaces is provide with at least one of the plurality of light-emitting elements.

In an embodiment of the invention, a light emitting axis of each of the plurality of light-emitting elements intersects with at least one of the plurality of opaque layers.

In an embodiment of the invention, each of the plurality of opaque layers corresponds to at least one of the plurality of light-emitting elements.

In an embodiment of the invention, a portion of the light emitted by the plurality of light-emitting elements is adapted to exit the panel through the optical film group and the panel, and another portion of the light is shielded by the plurality of opaque layers and the light shielding portion.

In an embodiment of the invention, the optical film group includes at least one of an optical diffusing film and an optical thin film.

In an embodiment of the invention, the optical film group includes a plurality of coating layers. The plurality of coating layers may be disposed on any surface of the optical diffusing film, or on any surface of the optical thin film, or individually on at least one surface of the at least one of the optical diffusing film and the optical thin film. Each of the plurality of coating layers intersects with a light emitting axis of each of the plurality of light-emitting elements.

In an embodiment of the invention, the plurality of coating layers includes a first coating layer and a second coating layer, and the first coating layer and the second coating layer are located on at least one surface of the at least one of the optical diffusing film and the optical thin film.

In an embodiment of the invention, the first coating layer and the second coating layer are located on two opposite surfaces of the at least one of the optical diffusing film and the optical thin film.

In an embodiment of the invention, the surface reflectance of the circuit board is greater than or equal to 50%.

In an embodiment of the invention, the circuit board is light in color.

In an embodiment of the invention, at least one portion of the projection of the first coating layer to the circuit board is overlapped with at least one portion of the projection of the second coating layer to the circuit board.

In an embodiment of the invention, the touch display device further includes a plurality of piezoelectric elements. The plurality of piezoelectric elements are disposed on the second surface of the circuit board.

In summary, the first control unit of the touch display device of the invention may control the first driver group to drive the piezoelectric elements to vibrate based on the user's touch input commands, so that the user may receive excellent vibration feedback when performing a touch operation. On the other hand, the second control unit of the touch display device may control the second driver group to drive the light emitting elements to emit light, so as to perform text or image display. Meanwhile, the touch display device adopts a backlight design. That is, each of the light-emitting elements disposed on the circuit board may be controlled independently, which enables a variety of texts or images to be displayed according to actual needs, allowing the display to be richer and more diverse.

To make the aforementioned features and advantages of the disclosure more comprehensible, the following specific embodiments are described in detail with reference to the accompanying drawings.

DESCRIPTION OF THE EMBODIMENTS

Figure 1:
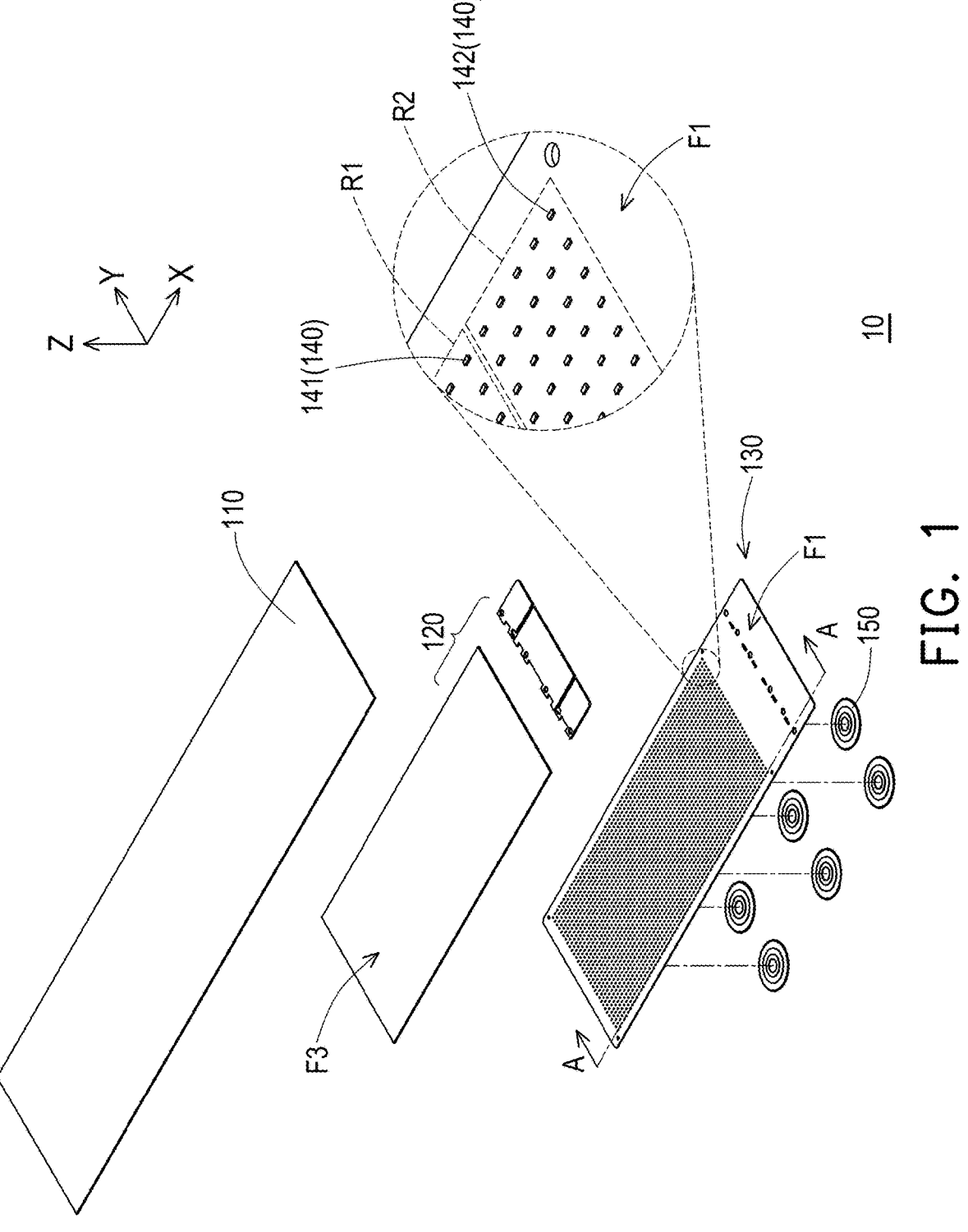
FIG. 1 is an exploded schematic view of a touch display device according to an embodiment of the invention.
Figure 2:
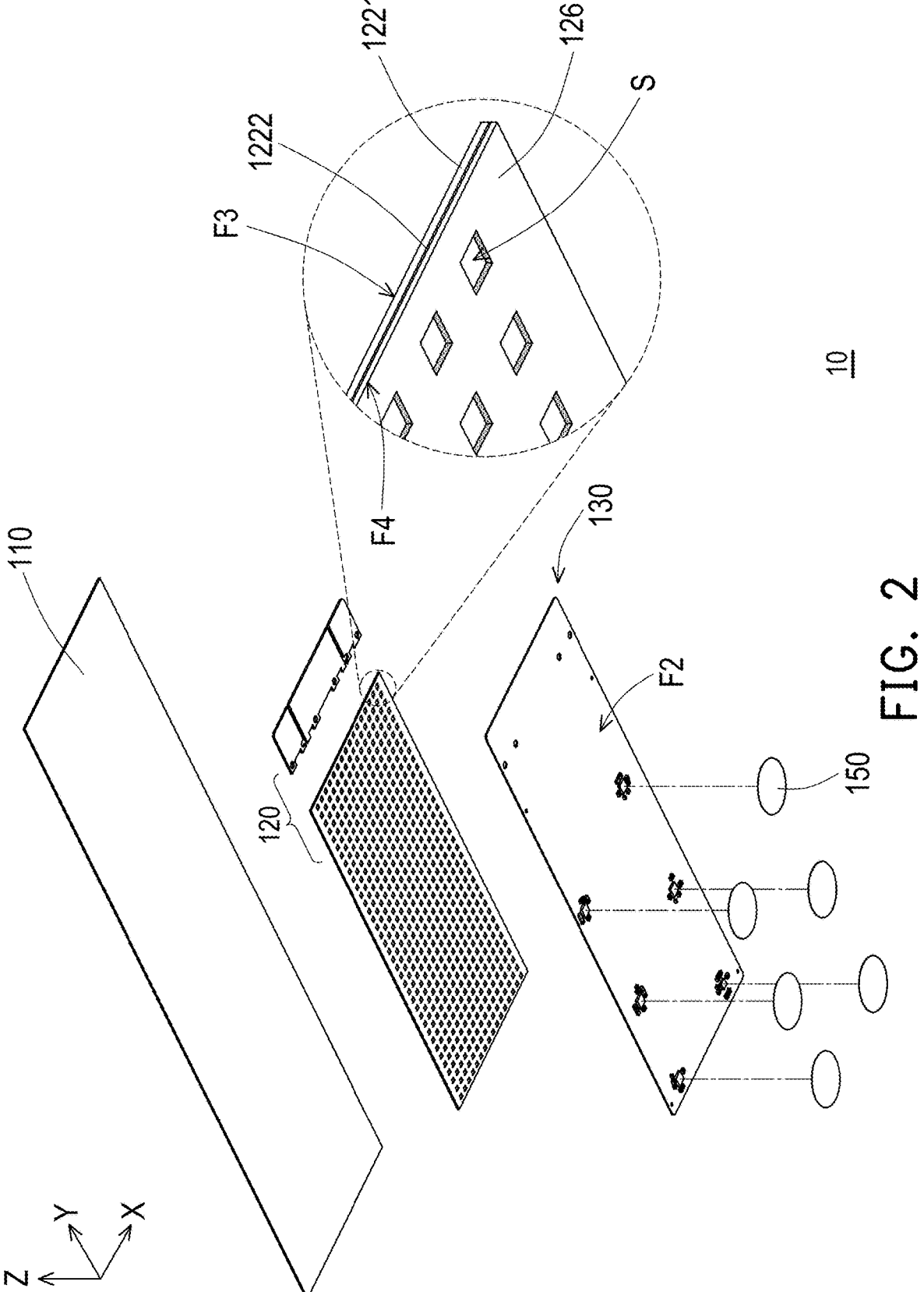
FIG. 2 is an exploded schematic view of FIG. 1 from another angle of view.
Figure 3:
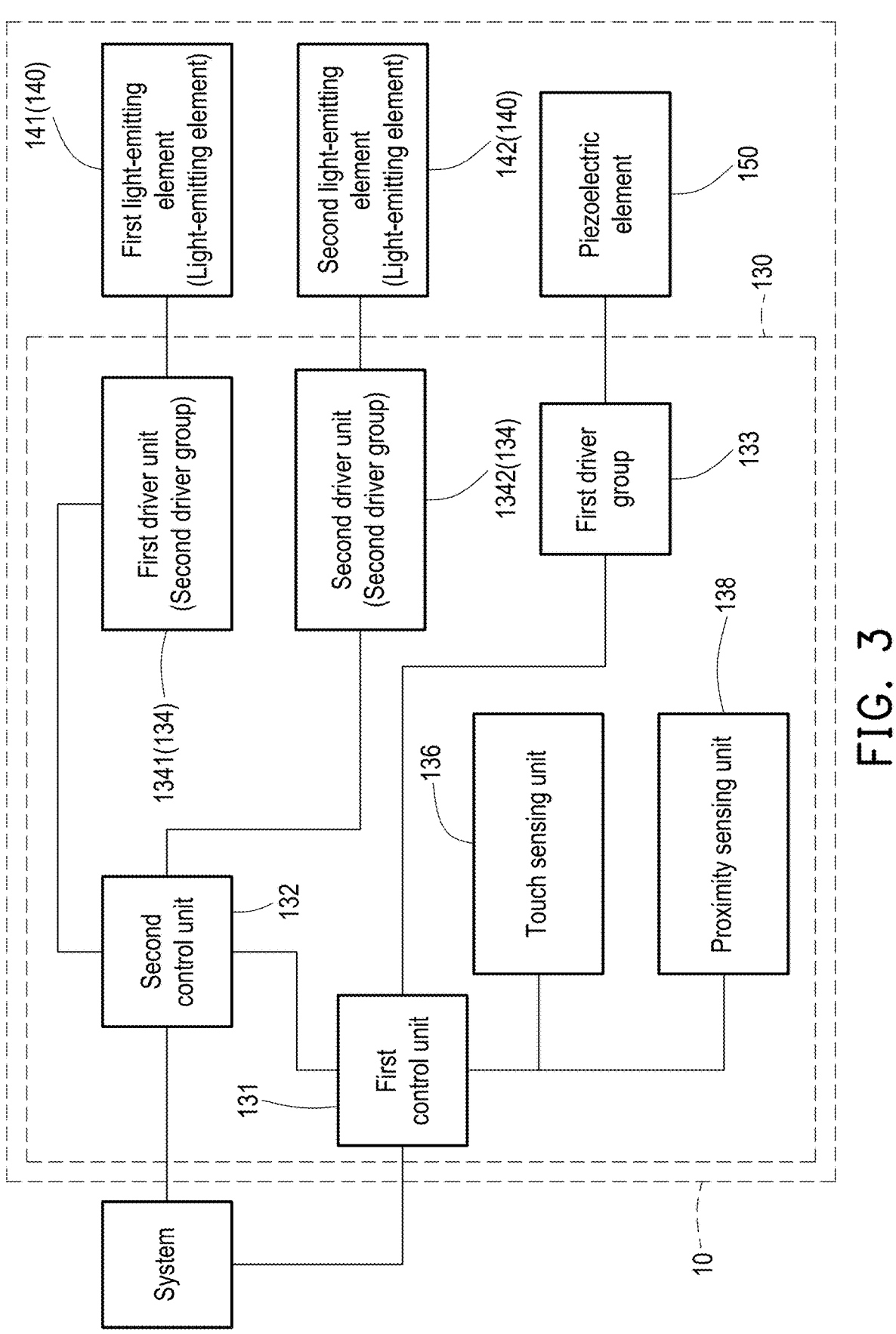
FIG. 3 is a schematic view of the touch display device of FIG. 1.

FIG. 1 is an exploded schematic view of a touch display device according to an embodiment of the invention. FIG. 2 is an exploded schematic view of FIG. 1 from another angle of view. FIG. 3 is a schematic view of the touch display device of FIG. 1. Referring to FIG. 1 to FIG. 3, in this embodiment, the touch display device 10 may be used as a touch pad of an electronic device such as a laptop computer, so that a user may touch the electronic device and operate its system, and may simultaneously generate and display texts or images. However, the application of the touch display device 10 is not limited thereto.

Substantially speaking, the touch display device 10 includes a panel 110, a backlight module 120, a circuit board 130, a plurality of light-emitting elements 140, and a plurality of piezoelectric elements 150. The circuit board 130 has a first surface F1 and a second surface F2 (FIG. 2) opposite to each other. The backlight module 120 is disposed on the first surface F1 of the circuit board 130. The light-emitting elements 140 are, for example, light emitting diodes (LEDs), which are disposed in arrays on the first surface F1 of the circuit board 130, and the light-emitting elements each are surrounded by the backlight module 120. The panel 110 is made of glass, for example, and is stacked on the third surface F3 of the backlight module 120 opposite to the first surface F1. In this embodiment, six piezoelectric elements 150 are shown and disposed on the second surface F2 of the circuit board 130 to be adapted to generate vibration, but the number of the piezoelectric elements 150 is not limited thereto.

As illustrated in FIG. 3, in this embodiment, a circuit board 130 is provided with a first control unit 131, a first driver group 133, a second control unit 132, and a second driver group 134. The first control unit 131 and the second control unit 132 are connected to the system of the electronic device, for example. The first control unit 131 is, for example, a capacitive touch processor, adapted to control the first driver group 133, such as a piezoelectric driver, to drive at least one of the plurality of piezoelectric elements 150 to vibrate. The second control unit 132 is, for example, a microcontroller, adapted to control the second driver group 134, such as a LED driver, to drive at least one of the plurality of light-emitting elements 140 to emit light.

Thus, the touch display device 10 may provide excellent vibration feedback when the user performs a touch operation, and may generate texts or images according to actual needs, such as images with changing appearances or customized texts or images, allowing the display to be richer and more diverse. The touch and display functions of the touch display device 10 will be further introduced below.

In the embodiment, the touch display device 10 further includes a touch sensing unit 136. The touch sensing unit 136 is electrically connected to the circuit board 130, so as to sense the user's touch input commands and generate corresponding touch sensing signals. When the user touches the panel 110 (FIG. 1) with a hand, for example, the touch sensing unit 136 may sense the user's touch input command by sensing the coordinates of the user's hand and generate a corresponding touch sensing signal. The first control unit 131 may then control the first driver group 133 to drive at least one of the plurality of piezoelectric elements 150 to vibrate according to the touch sensing signal, so that the user may obtain excellent tactile feedback without pressing the panel 110.

On the other hand, the second control unit 132 may control the second driver group 134 to drive the light-emitting element 140 to emit light according to the touch sensing signal. In detail, as illustrated in FIG. 1, the first surface F1 of the circuit board 130 may be divided into, for example, a first region R1 and a second region R2 located on a side of the first region R1, and the first region R1 and the second region R2 are adjacent to each other. The plurality of light-emitting elements 140 includes a plurality of first light-emitting elements 141 and a plurality of second light-emitting elements 142. The first light-emitting elements 141 and the second light-emitting elements 142 may be the same type of light-emitting element, wherein the first light-emitting elements 141 are disposed in the first region R1, and the second light-emitting elements 142 are disposed in the second region R2. In another embodiment, a portion of the plurality of first light-emitting elements 141 is disposed in the first region R1, and the other portion of the plurality of first light-emitting elements 141 is disposed in the second region R2, and meanwhile, a portion of the plurality of second light-emitting elements 142 is disposed in the first region R1, and the other portion of the plurality of second light-emitting elements 142 is disposed in the second region R2.

Note that the first region R1 and the second region R2 in FIG. 1 is only a schematic illustration, and it is not used to limit the sizes, shapes and positions of the first region R1 and the second region R2.

Referring to FIG. 3 and FIG. 1, in this embodiment, the second driver group 134 includes a first driver unit 1341 and a second driver unit 1342. When the touch sensing unit 136 senses the user's touch input command and generates a touch sensing signal, the second control unit 132 may control the first driver unit 1341 according to the touch sensing signal to drive at least one of the plurality of first light-emitting elements 141 (FIG. 1) to emit light, and may control the second driver unit 1342 to drive at least one of the plurality of second light-emitting elements 142 (FIG. 1) to emit light according to the touch sensing signal, thereby achieving separate control of the light sources in the first area R1 and the second area R2. Similarly, the touch sensing unit 136 may sense multiple touch input commands to generate multiple touch sensing signals, and the second control unit 132 may control the second driver group 134 to drive different light-emitting elements 140 (for example, different light-emitting elements in the plurality of first light-emitting elements 141 or the plurality of second light-emitting elements 142) to emit light according to the multiple touch sensing signals.

Note that the touch display device 10 in the embodiment adopts a design of direct illumination-type LED backlight. The plurality of light-emitting elements 140 are disposed on the first surface F1 of the circuit board 130 and face the panel 110, and each of the light-emitting elements 140 may be independently controlled. Therefore, the user may control the individual light-emitting elements 140 to emit light through software or programming to generate various light effects, thereby achieving rich and diverse text or image display. Two examples will be presented below to illustrate the display effect of the touch display device 10.

Figure 4A:
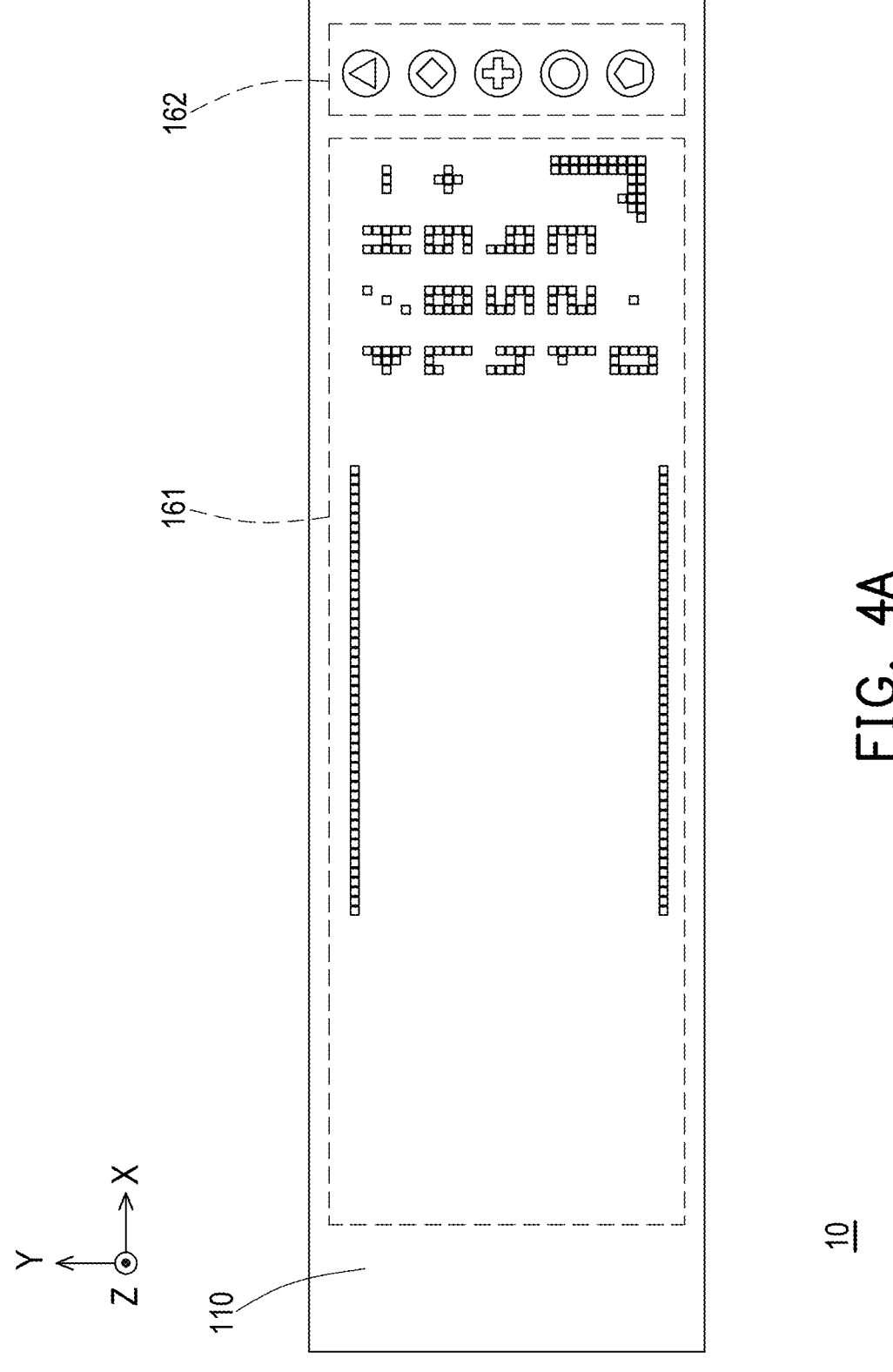
FIG. 4A is a schematic view of the touch display device of FIG. 1 in a use state.

FIG. 4A is a schematic view of the touch display device of FIG. 1 in a use state. Referring to FIG. 4A, for example, the panel 110 of the touch display device 10 may be divided into a first display area 161 and a second display area 162, and the first display area 161 and the second display area 162 correspond to the first area R1 and the second area R2 in FIG. 1, respectively. The first light-emitting elements 141 emit light in the first region R1 to form corresponding texts or images in the first display area 161. Similarly, the second light-emitting elements 142 emits light in the second region R2 to form corresponding texts or images in the second display area 162.

As illustrated in FIG. 4A, the text or image in the first display area 161 includes, for example, a graphical calculator interface, and the user may touch a number, a symbol, or an image in the graphical calculator interface to input numbers and symbols to produce a calculation result, enabling intuitive and convenient operation. On the other hand, the text or images in the second display area 162 may include, for example, shortcut icons in the sidebar, and the user may quickly trigger the corresponding function or program in the system by touching the shortcut icon, thereby increasing the speed for operation and fluency and enhancing the user experience.

Figure 4B:
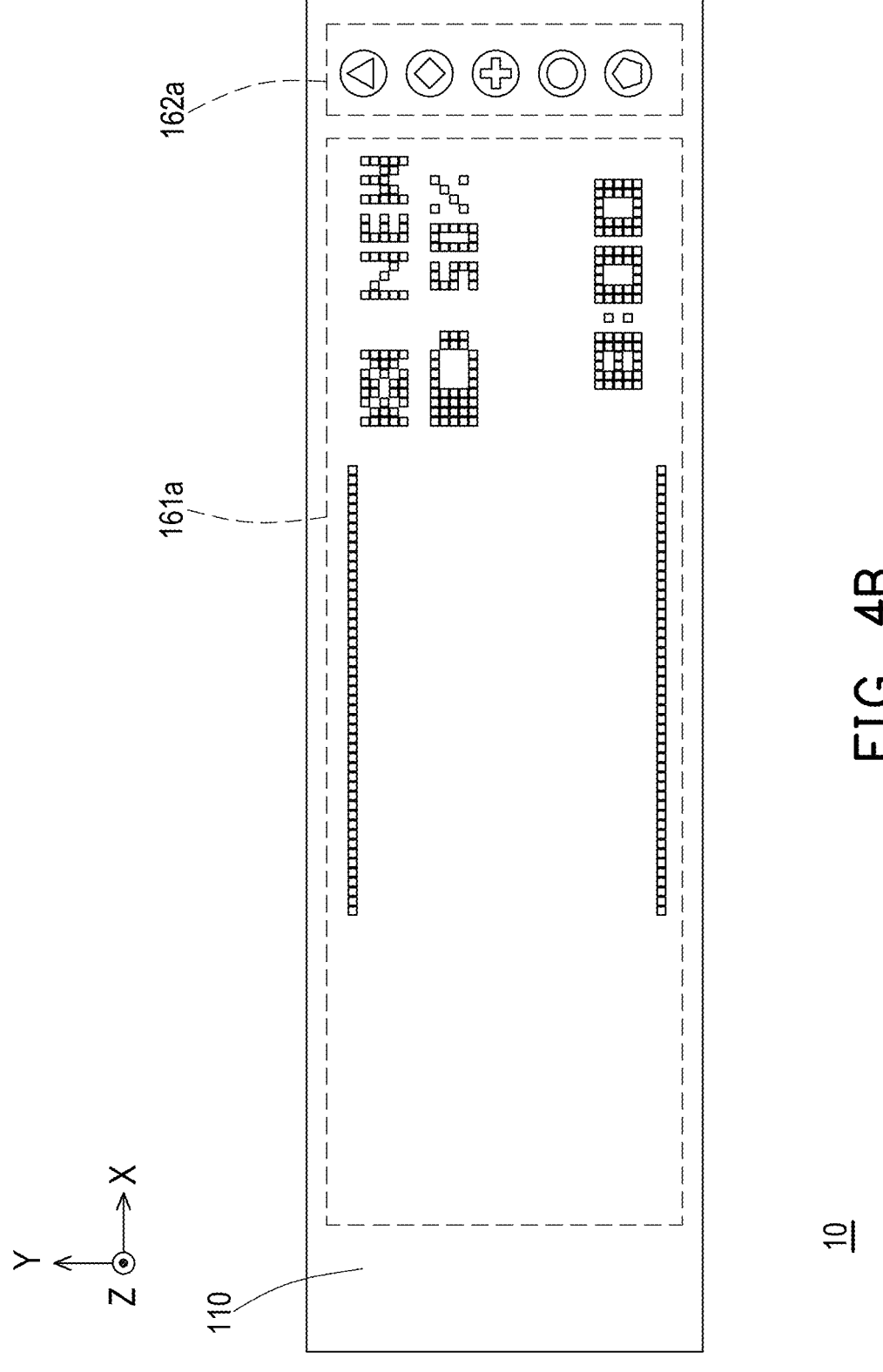
FIG. 4B is a schematic view of the touch display device of FIG. 1 in another use state.

FIG. 4B is a schematic view of the touch display device of FIG. 1 in another use state. As illustrated in FIG. 4B, the text or images in the first display area 161a includes, for example, system status icons, such as a system clock, email notification, and current remaining power, but the type of system status icons is not limited thereto. The form of the system status icons in this embodiment may be updated as the system status changes and may change without the user's touch input command. That is, the light-emitting elements 140 (FIG. 1) may or may not emit light regardless of the touch input command. On the other hand, the second display area 162a is identical or similar to the second display area 162 in FIG. 4A and may display shortcut icons of a sidebar. The user may quickly trigger the corresponding function or program in the system by touching the shortcut icon, thereby increasing the speed for operation and fluency and enhancing the user experience.

Note that FIG. 4A and FIG. 4B are only two exemplary display effects. The image displays of the first display area 161, 161a and the second display area 162, 162a may be programmed by software or programming languages, so that the user may generate images of different types and appearances according to actual needs, such as interactive images, fixed or changing images, or customized images, etc., greatly enhancing display diversity and flexibility.

In addition, the panel 110 in the embodiment includes two display areas (e.g., the first display area 161 and the second display area 162). In other embodiments, the panel 110 may have only one display area or more than two display areas, and the number of display areas is not limited thereto. For example, in an embodiment having only one display area, the circuit board 130 (FIG. 1) has only one area, and the second driver group 134 (FIG. 3) correspondingly has only one driver unit for driving one type of light-emitting elements 140 (FIG. 1) in the area.

In addition, as illustrated in FIG. 3, the touch display device 10 in the embodiment further includes a proximity sensing unit 138. The proximity sensing unit 138 is electrically connected to the circuit board 130 and may sense the distance between an external object and the panel 110 and generate a proximity sensing signal to wake the first control unit 131 and/or the second control unit 132 up. For example, when the touch display device 10 is idle, the first control unit 131 and the second control unit 132 may enter a sleep state. When the user wants to use the touch display device 10, the proximity sensing unit 138 is able to sense the user's approach and wake the first control unit 131 and/or the second control unit 132 up. This effectively saves power and improve the battery life of the device.

Figure 5:
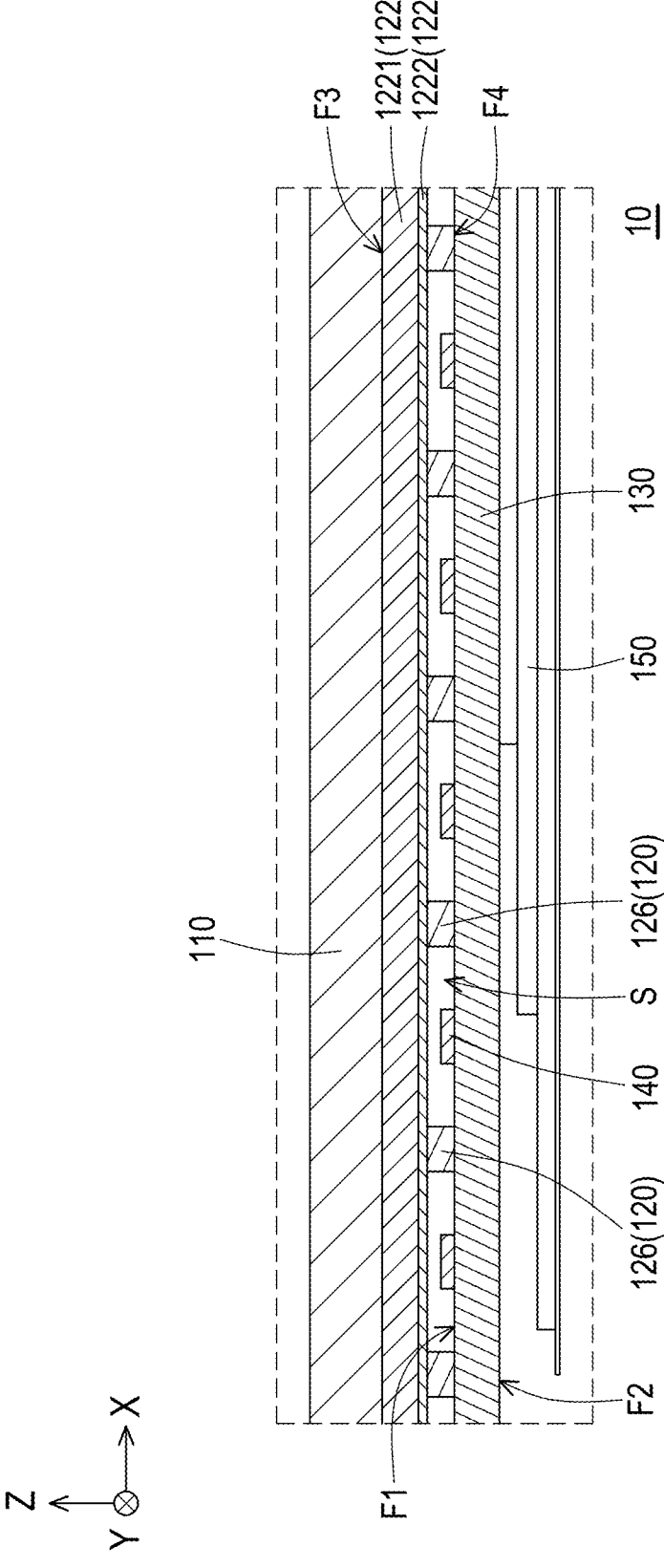
FIG. 5 is a partial cross-sectional view of the touch display device of FIG. 1, taken along line A-A.
Figure 6A:
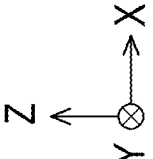
FIG. 6A is a partial enlarged schematic view of the touch display device of FIG. 5.

The light emitting of the touch display device 10 will be illustrated below. FIG. 5 is a partial cross-sectional view of the touch display device of FIG. 1, taken along line A-A. FIG. 6A is a partial enlarged schematic view of the touch display device of FIG. 5. Referring to FIG. 5 and FIG. 6Am, in the embodiment, the backlight module 120 includes an optical film group 122, light shielding portions 126, and a plurality of accommodating spaces S. The panel 110 is stacked on the optical film group 122 and is fixed to the third surface F3 of the optical film group 122 via, for example, an adhesive layer G such as glue. The optical film group 122 is stacked on the light shielding portions 126 via, for example, an adhesive layer G. The optical film group 122 is located between the panel 110 and the light shielding portions 126.

The light shielding portions 126 is adjacent to the plurality of accommodating spaces S and are secured to the first surface F1 of the circuit board 130. In other words, each of the accommodating spaces S is adjacent to the light shielding portions 126. Specifically, the light shielding portions 126 are recessed toward a fourth surface F4 of the circuit board 130 to form the plurality of accommodating spaces S. The plurality of light-emitting elements 140 are located in the plurality of accommodating spaces S individually or in groups. In other words, each of the accommodating spaces S is provided with at least one light-emitting element 140. The light shielding portion 126 is, for example, opaque plastic, and is applied to shield the light emitted by the light-emitting element 140.

As depicted in FIG. 6A, the optical film group 122 includes a plurality of coating layers 1223, and an optical diffusing film 1221 and an optical thin film 1222 stacked to each other. The optical diffusing film 1221 is, for example, a diffuser film. The optical thin film 1222 is, for example, a mylar film. The optical diffusing film 1221 and the optical thin film 1222 may evenly diffuse the light emitted by the light-emitting element 140 to realize an atomization effect. In this embodiment, the optical diffusing film 1221 and the optical thin film 1222 are connected to each other through the adhesive layer G. In another embodiment, the optical diffusing film 1221 and the optical thin film 1222 are separate. In other embodiments, the optical film group 122 may include only one of the optical diffusing film 1221 and the optical thin film 1222.

Moreover, the plurality of coating layers 1223 may be disposed on at least one surface of at least one of the optical diffusing film 1221 and the optical thin film 1222, and may be located, for example, directly above the corresponding light-emitting element 140. Each of the plurality of coating layers 1223 intersects a light emitting axis of at least one light-emitting element 140. In this embodiment, the plurality of coating layers 1223 at least include a first coating layer 1223a and a second coating layer 1223b. The first coating layer 1223a is, for example, a white-printed layer. The second coating layer 1223b is, for example, a silver-printed layer. The first coating layer 1223a and the second coating layer 1223b are applied to reduce the amount of light, so as to prevent the light emitted by the light-emitting element 140 from directly exiting through the optical diffusing film 1221 and the optical thin film 1222 and resulting in excessive brightness.

The first coating layer 1223a and the second coating layer 1223b are located on two opposite surfaces of at least one of the optical diffusing film 1221 and the optical thin film 1222. For example, the first coating layer 1223a and the second coating layer 1223b of this embodiment are located on the upper and lower sides of the optical thin film 1222, respectively. At least a portion of the projection of the first coating layer 1223a to the circuit board 130 is overlapped with at least a portion of the projection of the second coating layer 1223b to the circuit board 130. In another embodiment, the first coating layer 1223a and the second coating layer 1223b are respectively located on the upper and lower sides of the optical diffusing film 1221. In another embodiment, the first coating layer 1223a is located on the upper side of the optical diffusing film 1221, and the second coating layer 1223b is located on the lower side of the optical thin film 1222. The locations of the first coating layer 1223a and the second coating layer 1223b in the optical film group 122 may be adjusted based on actual needs, as long as they are disposed directly above the light-emitting element 140. In other embodiments, there may be only one coating layer 1223, but the number and type of coating layers 1223 are not limited thereto.

Figure 6B:
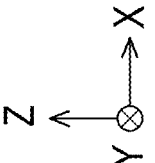
FIG. 6B is a schematic view of a light path of the touch display device of FIG. 6A.

F FIG. 6B is a schematic view of a light path of the touch display device of FIG. 6A. Note that multiple bold arrows are schematically drawn to represent the travel paths of the light emitted by the light-emitting element 140 in FIG. 6B. Referring to FIG. 6B, in the embodiment, a portion of the light emitted by the light-emitting element 140 passes through the optical thin film 1222, the optical diffusing film 1221, and the panel 110, and exits out of the panel.

On the other hand, another portion of the light emitted by the light-emitting element 140 may be reflected once or multiple times in the accommodating space S, and then pass through the optical thin film 1222 and the optical diffusing film 1221 to exit the panel 110. The color of the circuit board 130 in the embodiment is, for example, a light color, so that the surface reflectance of the circuit board 130 is greater than or equal to 50%, thus improving the light reflection. When the light emitted by the light-emitting element 140 travels toward the coating layer 1223, such as the second coating layer 1223b, the light may be first reflected by the second coating layer 1223b and then further reflected by the light-colored circuit board 130, so that the light travels toward the optical thin film 1222, the optical diffusing film 1221, and the panel 110, and finally exits the touch display device 10, allowing excellent light emitting.

In addition, since the light shielding portion 126 is made of an opaque material and surrounds the light-emitting element 140, the light emitted by the light-emitting element 140 may be restricted to a specific range according to design requirements while preventing light leakage in an effective manner.

Figure 7:
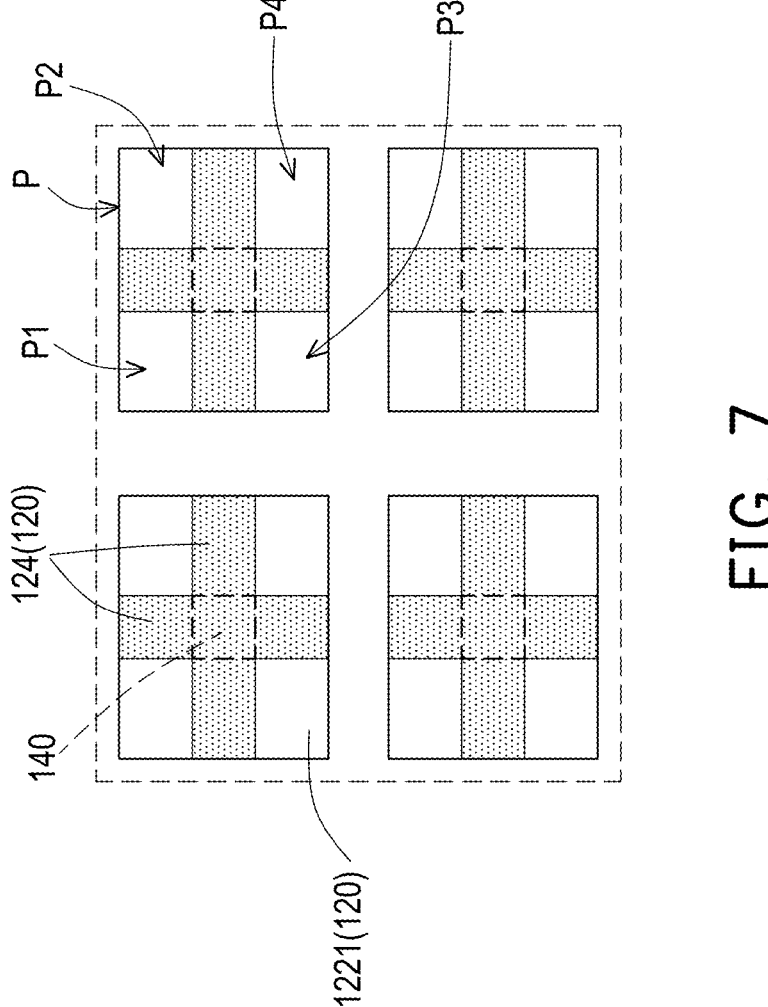
FIG. 7 is a partial top view of the touch display device of FIG. 1.
Figure 7:
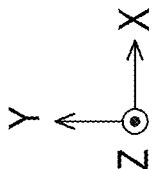

FIG. 7 is a partial top view of the touch display device of FIG. 1. To clearly visualize the internal structure of the touch display device, the panel is hidden and the light-emitting elements 140 are drawn with dotted lines in FIG. 7. In addition, to clearly visualize the opaque layers 124, the areas covered by the opaque layers 124 are drawn with dotted lines in FIG. 7.

Referring to FIG. 7, in the embodiment, the backlight module 120 further includes a plurality of opaque layers 124. The opaque layers 124 are, for example, black-printed layers. The plurality of opaque layers 124 are attached to the optical diffusing film 1221, and each of the opaque layers 124 corresponds to at least one light-emitting element 140. The middle of each of the opaque layers 124 is, for example, located directly above the corresponding light-emitting element 140.

When the light-emitting element 140 is activated, a portion of the light emitted by the light-emitting element 140 may exit the panel 110 through the optical film group 122 and the panel 110 as described above, while another portion of the light emitted by the light-emitting element 140 may be shielded by the opaque layer 124 and the light shielding portions 126 (FIG. 6A). With the existence of the opaque layer 124, excessive brightness due to direct light exposure may be avoided in a light emitting region P of each of the light-emitting elements 140. Meanwhile, the opaque layer 124 disposed in the middle of the light emitting region P may divide the original single light emitting region P into four regions (for example, light emitting regions P1, P2, P3, and P4 in FIG. 7), further enhancing the resolution and display effects.

Figure 8:
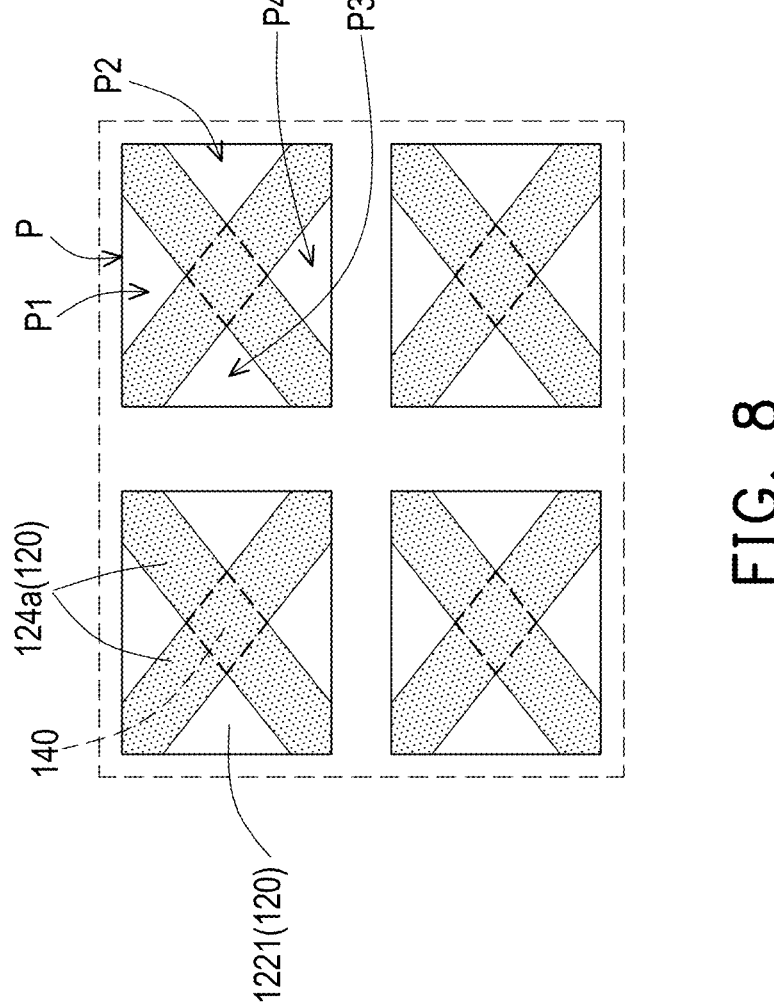
FIG. 8 is a partial top view of a touch display device according to another embodiment of the invention.

FIG. 8 is a partial top view of a touch display device according to another embodiment of the invention. A main difference between the embodiment illustrated in FIG. 8 and the embodiment illustrated in FIG. 7 is that the configuration of the opaque layers 124a in FIG. 8 is different from that of the opaque layers 124 in FIG. 7. Specifically, the opaque layer 124 in FIG. 7 is arranged in a cross shape, and are formed by two pieces arranged perpendicular to each other. In contrast, the opaque layers 124a in FIG. 8 are arranged in a non-cross shape. More specifically, two pieces of the opaque layer 124a are arranged crosswise and not perpendicular to each other, and extend to the corners between adjacent light emitting regions P (e.g., light emitting regions P1, P2, P3, and P4 in FIG. 8), thereby enhancing the resolution and display effects.

In summary, the first control unit of the touch display device of the invention may control the first driver group to drive the piezoelectric elements to vibrate based on the user's touch input commands, so that the user may receive excellent tactile feedback when performing a touch operation. On the other hand, the second control unit of the touch display device may control the second driver group to drive the light-emitting elements to emit light, so as to perform text or image display. Meanwhile, the touch display device adopts a design of direct illumination-type LED backlight. Each of the light-emitting elements disposed on the circuit board may be controlled independently, which enables a variety of text or image to be displayed according to actual needs, allowing the display to be richer and more diverse. In addition, the backlight module of the touch display device includes a plurality of opaque layers, which may divide a single light emitting region into four regions, thereby further enhancing the resolution and display effects.

Lastly, it should be noted that each of the above embodiments is used to describe the technical solutions of the invention instead of limiting them. Although the invention has been described in detail with reference to each embodiment above, those having ordinary skill in the art should understand that the technical solution recited in each embodiment above may still be modified, or some or all of the technical features thereof may be combined or equivalently replaced. These modifications, combinations, or replacements do not make the essence of the corresponding technical solutions depart from the scope of the technical solution of each embodiment of the invention.

What is claimed is:

1. A touch display device, comprising:
    a circuit board having a first surface and a second surface opposite to each other, wherein the circuit board is provided with a first control unit, a first driver group, a second control unit, and a second driver group;
    a backlight module, disposed on the first surface of the circuit board;
    a plurality of light-emitting elements, disposed in arrays on the first surface of the circuit board, wherein each of the plurality of light-emitting elements is surrounded by the backlight module;
    a plurality of piezoelectric elements, disposed on the second surface of the circuit board; and
    a panel, stacked on the backlight module, wherein the first surface faces the panel, and
    wherein the first control unit is adapted to control the first driver group to drive at least one of the plurality of piezoelectric elements to vibrate, and the second control unit is adapted to control the second driver group to drive at least one of the plurality of light-emitting elements to emit light.

2. The touch display device according to claim 1, wherein the backlight module comprises a plurality of accommodating spaces, and the plurality of light-emitting elements are located in the plurality of accommodating spaces individually or in groups.

3. The touch display device according to claim 1, wherein the backlight module comprises a plurality of accommodating spaces, and each of the plurality of accommodating spaces is provided with at least one of the plurality of light-emitting elements.

4. The touch display device according to claim 1, further comprising a touch sensing unit, wherein the touch sensing unit is electrically connected to the circuit board and is adapted to sense a touch input command and generate a touch sensing signal.

5. The touch display device according to claim 4, wherein the first control unit is adapted to control the first driver group to drive the at least one of the plurality of piezoelectric elements to vibrate according to the touch sensing signal.

6. The touch display device according to claim 4, wherein the second control unit is adapted to control the second driver group to drive the at least one of the plurality of light-emitting elements to emit the light according to the touch sensing signal.

7. The touch display device according to claim 4, wherein the touch sensing unit is adapted to sense a plurality of touch input commands and generate a plurality of touch sensing signals, and the second control unit is adapted to control the second driver group to drive different light-emitting elements among the plurality of light-emitting elements to emit light according to the plurality of touch sensing signals.

8. The touch display device according to claim 1, wherein the plurality of light-emitting elements comprise a plurality of first light-emitting elements and a plurality of second light-emitting elements, the circuit board has a first area and a second area adjacent to each other, the plurality of first light-emitting elements are disposed in the first area, and the plurality of second light-emitting elements are disposed in the second area.

9. The touch display device according to claim 8, wherein the second driver group comprises a first driver unit and a second driver unit, the first driver unit is adapted to drive at least one of the plurality of first light-emitting elements to emit light, and the second driver unit is adapted to drive at least one of the plurality of second light-emitting elements to emit light.

10. The touch display device according to claim 1, further comprising a proximity sensing unit, wherein the proximity sensing unit is electrically connected to the circuit board and is adapted to sense a distance between an external object and the panel and generate a proximity sensing signal, and the proximity sensing signal wakes the first control unit and the second control unit up.

11. A touch display device, comprising:
  a circuit board, having a first surface and a second surface opposite to each other;
  a backlight module, disposed on the first surface of the circuit board and comprising an optical film group, a light shielding portion, a plurality of accommodating spaces, and a plurality of opaque layers, wherein the light shielding portion is adjacent to the plurality of accommodating spaces, the optical film group is stacked on the light shielding portion, and the plurality of opaque layers are attached to the optical film group;
  a plurality of light-emitting elements, disposed in arrays on the first surface of the circuit board, wherein each of the plurality of opaque layers corresponds to at least one of the plurality of light-emitting elements, and each of the plurality of light-emitting elements is located in one of the plurality of accommodating spaces; and
  a panel, stacked on the optical film group.

12. The touch display device according to claim 11, wherein a portion of light emitted by the plurality of light-emitting elements is adapted to exit the panel through the optical film group and the panel, and another portion of the light is shielded by the plurality of opaque layers and the light shielding portion.

13. The touch display device according to claim 11, wherein the optical film group comprises at least one of an optical diffusing film or an optical thin film that are stacked to each other.

14. The touch display device according to claim 13, wherein the optical film group comprises a plurality of coating layers, and the plurality of coating layers are disposed on at least one surface of the at least one of the optical diffusing film and the optical thin film.

15. The touch display device according to claim 14, wherein each of the plurality of coating layers intersects with a light emitting axis of the at least one of the plurality of light-emitting elements.

16. The touch display device according to claim 14, wherein the plurality of coating layers comprises a first coating layer and a second coating layer, and the first coating layer and the second coating layer are located on two opposite surfaces of the at least one of the optical diffusing film and the optical thin film.

17. The touch display device according to claim 11, wherein a surface reflectance of the circuit board is greater than or equal to 50%.

18. The touch display device according to claim 11, further comprising a plurality of piezoelectric elements, wherein the plurality of piezoelectric elements are disposed on the second surface of the circuit board.

* * * * *